(12) United States Patent
Balakrishnan et al.

(10) Patent No.: US 10,964,709 B2
(45) Date of Patent: Mar. 30, 2021

(54) STACKED FINFET EEPROM

(71) Applicant: INTERNATIONAL BUSINESS MACHINES CORPORATION, Armonk, NY (US)

(72) Inventors: Karthik Balakrishnan, White Plains, NY (US); Pouya Hashemi, White Plains, NY (US); Tak H. Ning, Yorktown Heights, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/352,222

(22) Filed: Mar. 13, 2019

(65) Prior Publication Data

US 2019/0214398 A1  Jul. 11, 2019

Related U.S. Application Data

(62) Division of application No. 15/825,678, filed on Nov. 29, 2017, now Pat. No. 10,304,844.

(51) Int. Cl.
*H01L 27/11521* (2017.01)
*H01L 27/11568* (2017.01)
*H01L 27/112* (2006.01)
*H01L 27/092* (2006.01)
*H01L 29/78* (2006.01)
(Continued)

(52) U.S. Cl.
CPC .... *H01L 27/11521* (2013.01); *G11C 16/0466* (2013.01); *H01L 27/0694* (2013.01); *H01L 27/0922* (2013.01); *H01L 27/11226* (2013.01); *H01L 27/11551* (2013.01); *H01L 27/11568* (2013.01); *H01L 27/1211* (2013.01); *H01L 29/7855* (2013.01); *H01L 29/7884* (2013.01)

(58) Field of Classification Search
None
See application file for complete search history.

(56) References Cited

U.S. PATENT DOCUMENTS 8,705,280 B2  4/2014  Cai et al.
9,627,270 B2  4/2017  Cheng et al.
(Continued)

OTHER PUBLICATIONS

List of IBM Patents or Patent Applications Treated as Related dated Mar. 13, 2019, 2 pages.
(Continued)

*Primary Examiner* — Mounir S Amer
(74) *Attorney, Agent, or Firm* — Tutunjian & Bitetto, P.C.; L. Jeffrey Kelly

(57) ABSTRACT

A method for integrating a stack of fins to form an electrically erasable programmable read-only memory (EEPROM) device is presented. The method includes forming a stack of at least a first fin structure and a second fin structure over a semiconductor substrate, forming a sacrificial gate straddling the stack of at least the first fin structure and the second fin structure, forming a first conductivity type source/drain region to the first fin structure, and forming a second conductivity type source/drain to the second fin structure. The method further includes removing the sacrificial gate to form a gate opening, and forming a single floating gate in communication with a channel for each of the first and second fin structures.

19 Claims, 10 Drawing Sheets

(51) Int. Cl.
*H01L 27/06* (2006.01)
*H01L 27/12* (2006.01)
*G11C 16/04* (2006.01)
*H01L 27/11551* (2017.01)
*H01L 29/788* (2006.01)

(56) References Cited

U.S. PATENT DOCUMENTS 9,659,963 B2    5/2017   Cheng et al.
2013/0228842 A1*   9/2013   Kotou ............... H01L 29/42336
                                                                                                                                    257/315

OTHER PUBLICATIONS

Robertson et al., "Band offsets of wide-band gap oxides and implications for future electronic devices," Journal of Vacuum Science & Technology B: Microelectronics and Nanometer Structures Processing, Measurements, and Phenomena. vol. 18. No. 3. May/Jun. 2000. pp. 19-18.

* cited by examiner

STACKED FINFET EEPROM

BACKGROUND

Technical Field

The present invention relates generally to semiconductor devices, and more specifically, to integrating a stack of fin field effect transistors (FinFET's) to form an electrically erasable programmable read-only memory (EEPROM) device.

Description of the Related Art

Three-dimensional (3D) monolithic integration in which transistors are stacked on top of each other is a promising approach for continued transistor density scaling. In a 3D stacked fin complementary metal oxide semiconductor (CMOS) device, a self-aligned stack of fins can be formed where the top tier and bottom tier fins are used for devices with opposite conductivity types (i.e., p-type and n-type), respectively. Such an approach not only allows smaller footprint by stacking one type of fin field effect transistors (FinFETs) (e.g., p-type FinFETs) on top of a complementary type of FinFETs (e.g., n-type FinFET), but also permits use of different channel materials for two types of FinFETs simply by bonding appropriate device layers.

SUMMARY

In accordance with an embodiment, a method is provided for integrating a stack of fins to form an electrically erasable programmable read-only memory (EEPROM) device. The method includes forming a stack of at least a first fin structure and a second fin structure over a semiconductor substrate, forming a sacrificial gate straddling the stack of at least the first fin and the second fin structure, forming a first conductivity type source/drain region to the first fin structure, forming a second conductivity type source/drain region to the second fin structure, removing the sacrificial gate to form a gate opening, and forming a single floating gate in communication with a channel for each of the first and second fins. The single floating gate structure is for an EEPROM device that is in communication with a channel for each of the first and second fin structures. The method can further include electrically connecting one of the first conductivity type source/drain regions with one of the second conductivity type source/drain regions. This can provide a common node for electrical communication with an access transistor to the EEPROM device.

In accordance with an embodiment, a semiconductor device is provided. The semiconductor device includes a first FET connected to a first terminal and a common node, a second FET connected to a second terminal and the common node, and an access transistor connected in series to the common node and a low voltage terminal, the access transistor configured to trigger hot-carrier injection to a common floating gate of the first and second FETs to change a voltage of the common floating gate. In some embodiments, the first FET includes a first fin structure that includes the first channel region of the first FET, and the second FET includes a second fin structure that includes the second channel region of the second FET. In some embodiments, the first fin structure and the second fin structure are stacked so that first sidewalls of the first fin structure are aligned with second sidewalls of the second fin structure.

In accordance with another embodiment, a semiconductor structure is provided. The semiconductor structure includes a stack of at least a first fin structure and a second fin structure. First conductivity type source/drain regions can be present on opposing ends of a first channel region of the first fin structure and second conductivity type source/drain regions can be present on opposing ends of a second channel region of the second fin structure. A single floating gate can be present on both of the first and second channel regions of the first and second fin structures. The single floating gate provides electrical communication between a first field effect transistor including the first fin structure and a second field effect transistor including the second fin structure in an EEPROM memory device.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 2:
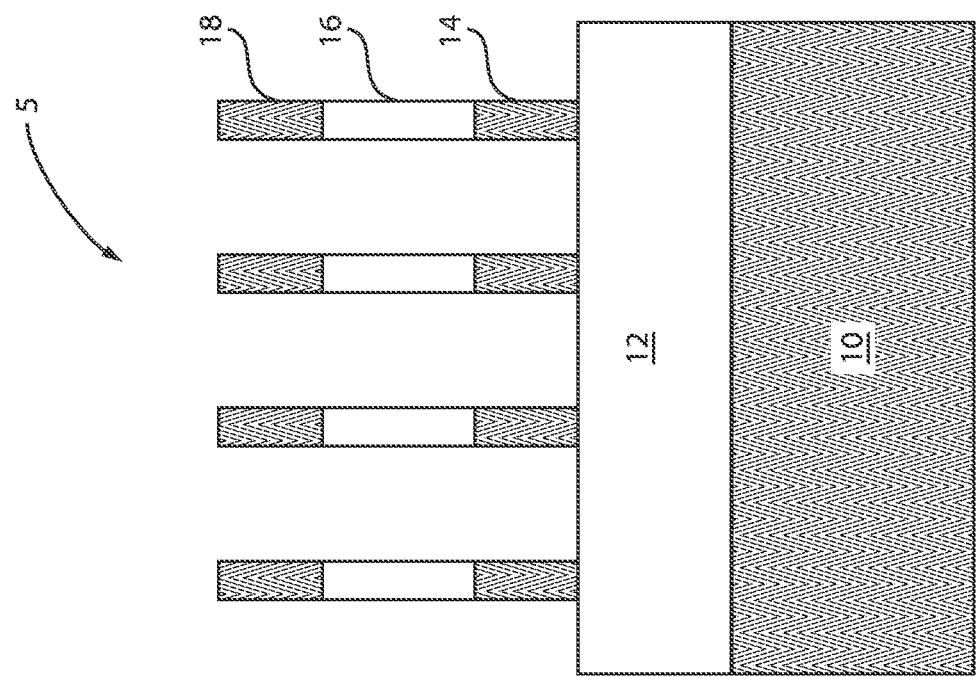
FIG. 2 is a cross-sectional view of a semiconductor structure including a stack of fins formed over a substrate along a width of a fin, in accordance with an embodiment of the present invention.

Embodiments in accordance with the present invention provide methods and devices for three-dimensional (3D) monolithic integration in which transistors are stacked on top of each other. One type of field effect transistor (FET) that facilitates increased device density is a double gated FET (FinFET). FinFETs use two gates, one on each side of a fin body (e.g., transistor body), to facilitate scaling of complementary metal oxide semiconductor (CMOS) dimensions, while maintaining an acceptable performance. In particular, the use of a double gate suppresses short channel effects (SCE), provides for lower leakage, and further provides for more ideal switching behavior. In addition, the use of the double gate increases gate area, which allows the FinFET to have better current control, without increasing the gate length of the device. As such, the FinFET is able to have the current control of a larger transistor without requiring the device space of the larger transistor. Also, shorter interconnect routing can be achieved utilizing shorter vertical wiring rather than longer horizontal wiring.

Embodiments in accordance with the present invention provide methods and devices for three-dimensional (3D) monolithic integration in which transistors are stacked on top of each other by integrating a stack of FinFETs to form an electrically erasable programmable read-only memory (EEPROM) device. FinFETs are field effect transistors in which at least the channel region of the device is present in the fin structure of semiconductor material. The stacked FinFET includes a stacked n-type field effect transistor (nFET) and p-type field effect transistor (pFET) on top of each other. For example, the fin structure of the n-type FinFET can be stacked atop the fin structure of the p-type FinFET, and vice versa, so that the sidewalls of the fin structures are aligned with one another. In some embodiments, the stack of the two fin structures can further include a dielectric material positioned therebetween. The stacked FinFET structures are employed to form or fabricate EEPROM devices which can be integrated with high performance stacked FinFETs. The different conductivity types of the stacks of FinFETs enable the formation of a common floating gate of the EEPROM device.

Examples of semiconductor materials that can be used in forming the fin structures for such fin stacks include silicon (Si), germanium (Ge), silicon germanium alloys (SiGe), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
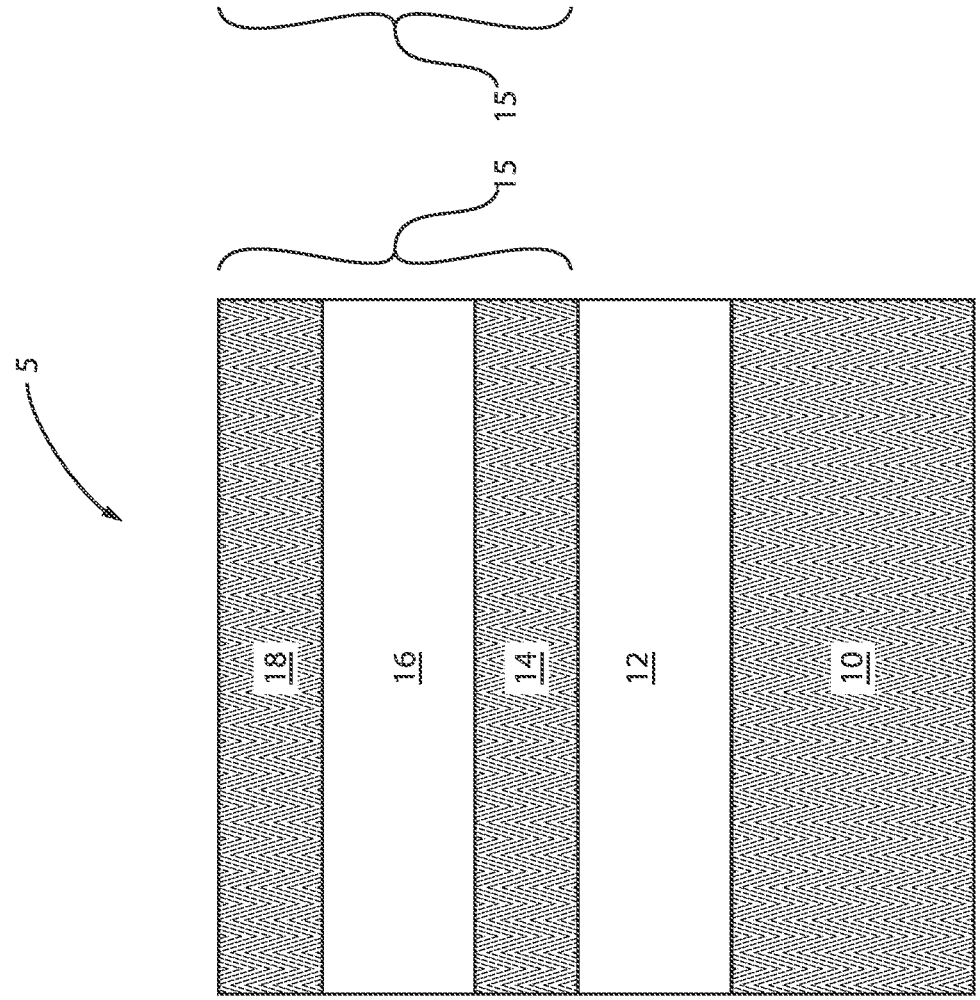
FIG. 1 is a cross-sectional view of a semiconductor structure including a stack of fins formed over a substrate along a length of a fin, in accordance with an embodiment of the present invention.

FIG. 1 is a cross-sectional view of a semiconductor structure including a stack 15 of fin structures 14, 18 formed over a substrate 10 along a length of a fin structure, in accordance with an embodiment of the present invention, whereas FIG. 2 is a cross-sectional view of a semiconductor structure including a stack 15 of fin structures 14, 18 formed over a substrate 10 along a width of a fin structure (e.g., the fin structures identified by reference numbers 14, 18, in accordance with an embodiment of the present invention).

A semiconductor structure 5 includes a semiconductor substrate 10. A fin stack 15 can be formed over the substrate 10. In one example, the substrate 10 can be, e.g., a (Si) substrate. The fin stack 15 includes a first fin structure 14 and a second fin structure 18 having a dielectric material 16 that is present therebetween. As depicted in FIG. 2, the sidewalls of the first fin structure 14, the dielectric material 16, and the second fin structure 18 can be aligned to one another.

In some embodiments, the fin stack 15 and the semiconductor substrate 10 can be provided by a method sequence that includes depositing semiconductor and dielectric material layers atop a semiconductor on insulator (SOI) substrate. In this example, the SOI substrate includes a base semiconductor substrate that provides the semiconductor substrate identified by reference number 10. The SOI substrate also includes a buried oxide (BOX) layer 12 that is present atop the base semiconductor substrate, and an SOI layer that provides the material layer for producing the first fin structure 14 of the stack 15.

In some embodiments, a dielectric material layer is blanket deposited atop the SOI layer of the SOI substrate to provide the material layer that provides the dielectric material 16 of the stack 15, and a semiconductor layer is deposited for the second fin structure 18. This describes the process sequence for providing the material layers that can be etched to provide a stack 15 of two fin structures 14, 18 beginning with an SOI substrate. The use of an SOI substrate is not required. For example, beginning with a bulk semiconductor substrate to provide semiconductor substrate 10, any material layers can be deposited atop the bulk semiconductor substrate to provide the dielectric material layers identified by reference numbers 12 and 16, and the semiconductor material layers identified by reference numbers 14 and 18.

Referring to FIGS. 1 and 2, each stack 15, can be formed from the aforementioned initial structures using subtractive methods and photolithography, wherein each stack includes a first fin structure 14 and a second fin structure 18 separated by a dielectric material 16. The lithographic step includes applying a photoresist layer (not shown) to form an etch mask atop the semiconductor material layer that provides the second fin structure 18, exposing the photoresist layer to a desired pattern of radiation, and developing the exposed photoresist layer utilizing a conventional resist developer.

Using the photoresist mask, the geometry of the stacks 15 can be defined by etching. The etching process can be a dry etch and/or a wet chemical etch. Illustrative examples of suitable dry etching processes that can be used in the present application include reactive ion etch (RIE), ion beam etching, plasma etching or laser ablation. Usually, a RIE process is used. In some embodiments, the process sequence for forming the stacks 15 can include sidewall image transfer (SIT). Sidewall image transfer (SIT) is another form of subtractive etching that includes forming a mandrel over the material layers to be etched, forming a spacer on the sidewall of the mandrel, and then removing the mandrel selectively to the spacer. The spacer is then used as an etch mask to pattern the underlying layers.

The stacks 15 formed using the aforementioned subtractive methods each include two fin structures 14, 18 having a dielectric material 16 present therebetween. Because each of these features in the stack 15 are defined using the same etch mask, i.e., either by SIT processing or by a general photoresist etch mask, the sidewalls for each of the two fin structures 14, 18 and the dielectric material 16 are aligned to one another.

The first and second fin structures 14, 18 can include a semiconducting material such as, for example, Si, Si:C (carbon doped Silicon), SiGe, SiGe:C (carbon doped SiGe), GaAs, InAs, InP as well as other III/V or III/VI compound semiconductors. The dielectric material 16 of the stack 15 that is present between the first and second fin structures 14, 18 serves as an insulator between the first fin structure 14 and the second fin structure 18. The dielectric layer 16 can include a dielectric material such as, for example, silicon oxide, silicon nitride, boron nitride, silicon oxynitride, or a combination thereof. The thickness of the dielectric layer 16 can be from about 50 nm to about 300 nm, although lesser and greater thicknesses can also be employed.

Similarly, the dielectric material 16, which can be provided by the buried oxide layer 12 of an SOI substrate, that is present underlying the stacks 15 may serve to isolate the stacks 15 from the semiconductor material of the supporting substrate 10. The semiconductor material of the supporting substrate 10 can be composed of a type IV or type III-V semiconductor material that can be the same or different from the semiconductor material of the first and second fin structures 14, 18.

Figure 4:
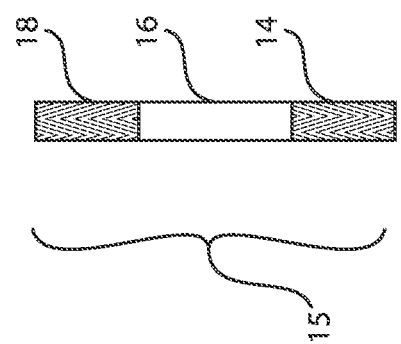
FIG. 4 is a cross-sectional view of a semiconductor structure including a stack of fins along a width of a fin, in accordance with an embodiment of the present invention.
Figure 3:
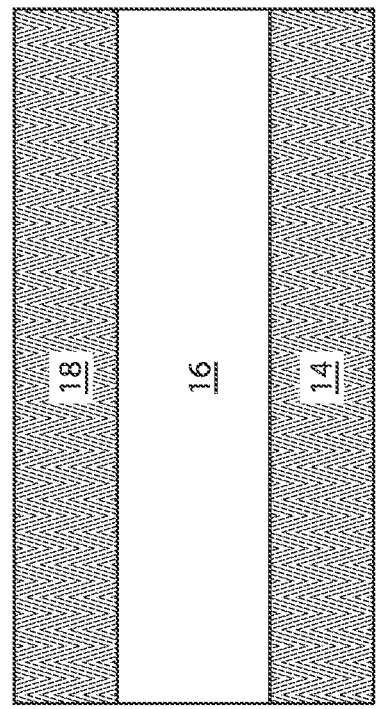
FIG. 3 is a cross-sectional view of a semiconductor structure including a stack of fins along a length of a fin, in accordance with an embodiment of the present invention.

FIG. 3 is a cross-sectional view of a semiconductor structure including a stack of fins along a length of a fin, in accordance with an embodiment of the present invention, whereas FIG. 4 is a cross-sectional view of a semiconductor structure including a stack of fins along a width of a fin, in accordance with an embodiment of the present invention. In FIGS. 3 and 4, the supporting substrate 10 and the dielectric layer 12 have been omitted.

Figure 6:
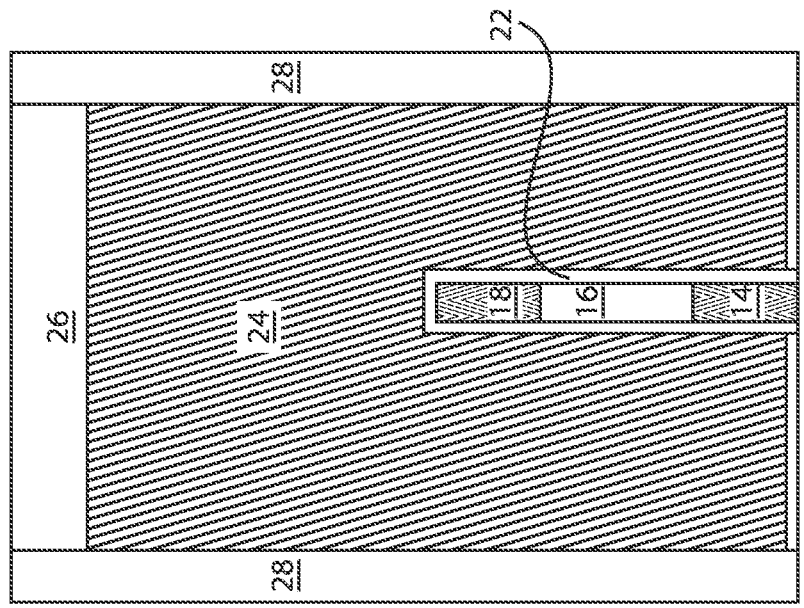
FIG. 6 is a cross-sectional view of FIG. 4 along a width of a fin where a sacrificial gate and spacers are formed, in accordance with an embodiment of the present invention.
Figure 5:
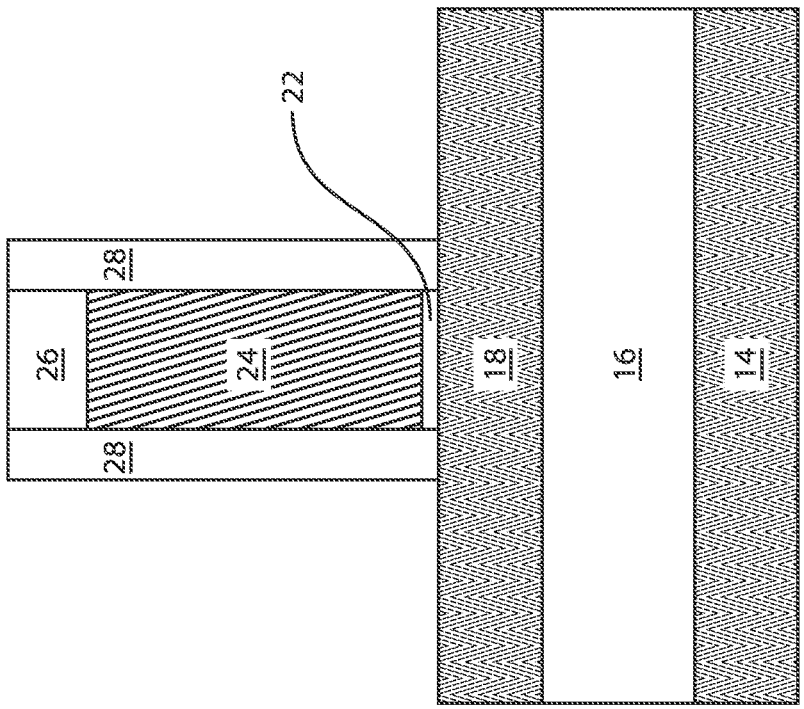
FIG. 5 is a cross-sectional view of FIG. 3 along a length of a fin where a sacrificial gate and spacers are formed, in accordance with an embodiment of the present invention.

FIG. 5 is a cross-sectional view of FIG. 3 along the length of the fin structures 14, 18, where a sacrificial gate structure is formed, whereas FIG. 6 is a cross-sectional view of FIG. 4 along a width of the fin structures 14, 18, where a sacrificial gate structure is formed, in accordance with an embodiment of the present invention.

The sacrificial gate structure is a structure that is employed in the process sequence for forming the final device structure, but the sacrificial gate structure is removed prior to finalizing the device structure. In some embodiments, the sacrificial gate structure provides the geometry for a later formed functional gate structure. The functional gate structure, which remains in the structure of the final device controls device switching, i.e., the electrical state of a device, e.g., FinFET, from "ON" to "OFF."

In various example embodiments, at least one sacrificial gate structure is formed over each of the fin stacks 15. In the embodiment depicted in FIGS. 5-8, the sacrificial gate structure includes a sacrificial gate dielectric 24, a sacrificial gate electrode 24, and a sacrificial gate cap 26. Because the sacrificial gate structure dictates the location and geometry of the later formed functional gate structure, the sacrificial gate structure is formed on the sidewalls of the channel regions of the first fin structure 14 and the second fin structure 18 of the fin stacks 15. For example, the sacrificial gate structure is formed on the exterior sidewalls of the first fin structure 14, the dielectric material 16 and the second fin structure 18 in the portions of the fin stacks 15 that are subsequently processed to provide the channel regions of fin type field effect transistors that are interconnected through a single floating gate structure, i.e., a functional gate structure, to provide EEPROM memory devices.

In some embodiments, the sacrificial gate dielectric 22 and/or the sacrificial gate cap 26 may be omitted. The sacrificial gate stack (22, 24, 26) can be formed by first providing a gate material stack (not shown) that includes, from bottom to top, a sacrificial gate dielectric layer, a sacrificial gate conductor layer and a sacrificial gate cap layer over the fins stacks 15 and the BOX layer 12. When present, the sacrificial gate dielectric layer 22 includes a dielectric material such as an oxide or a nitride. In one embodiment, the sacrificial gate dielectric layer 22 may include silicon oxide, silicon nitride, or silicon oxynitride. The sacrificial gate dielectric layer 22 that is formed can have a thickness from about 1 nm to about 10 nm, although lesser and greater thicknesses can also be employed.

The sacrificial gate conductor layer 24 can include a semiconductor material such as polysilicon or a silicon-containing semiconductor alloy such as a silicon-germanium alloy. The sacrificial gate conductor layer 24 can be formed using chemical vapor deposition (CVD) or plasma enhanced chemical vapor deposition (PECVD). The sacrificial gate conductor layer 24 that is formed can have a thickness from about 20 nm to about 300 nm, although lesser and greater thicknesses can also be employed.

The sacrificial gate cap layer 26 can include a dielectric material such as an oxide, a nitride or an oxynitride. In one embodiment, the sacrificial gate cap layer 26 is formed from silicon nitride. The sacrificial gate cap layer 26 can be formed utilizing a conventional deposition process including, for example, CVD and PECVD. The sacrificial gate cap layer that is formed can have a thickness from about 10 nm to about 200 nm, although lesser and greater thicknesses can also be employed.

The gate spacers 28 can include a dielectric material such as, for example, an oxide, a nitride, an oxynitride, or any combination thereof. For example, the gate spacers 28 can include silicon nitride, silicon boron carbon nitride, or silicon carbon oxynitride. The gate spacers 28 can be formed by first providing a conformal gate spacer material layer (not shown) on exposed surfaces of the sacrificial gate stacks (22, 24, 26) and the BOX layer 12 and then etching the conformal gate spacer material layer to remove horizontal portions of the conformal gate spacer material layer. The conformal gate spacer material layer can be provided by a deposition process including, for example, CVD, PECVD, or physical vapor deposition (PVD). The etching of the conformal gate spacer material layer can be performed by a dry etch process such as, for example, RIE. The remaining portions of the conformal gate spacer material layer constitute the gate spacer(s) 28. The width of each gate spacer 28, as measured at the base of the gate spacer 28 can be from about 5 nm to about 100 nm, although lesser and greater widths can also be employed.

In one example embodiment, the gate structure straddles over an exposed portion of the second semiconductor layer 18, the insulator material 16, and the first semiconductor layer 14. By "straddle over" or "straddling over" it is meant that at least one portion of a gate structure is located on one side of a fin or fin stack, while another portion of the same gate structure is located on another side of the fin or fin stack. The two portions are interconnected by a portion of the gate structure that is located directly atop each fin or fin stack. As noted above, the sacrificial gate structure is present on the channel region for each of the first fin structure 14 and the second fin structure 18.

Figure 8:
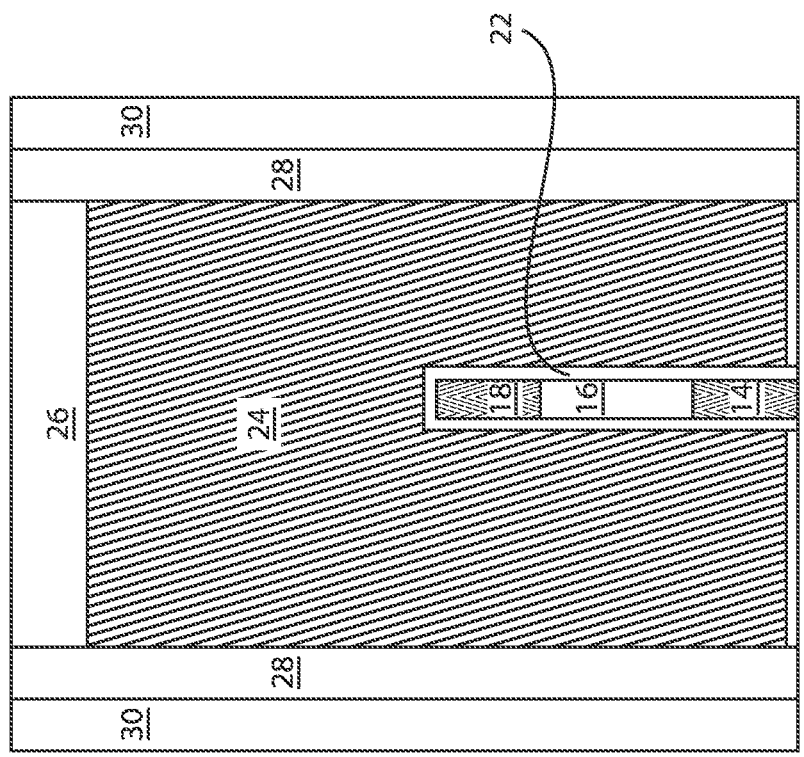
FIG. 8 is a cross-sectional view of FIG. 6 along a width of a fin where a dielectric layer is deposited over the sacrificial gate and spacers, in accordance with an embodiment of the present invention.
Figure 7:
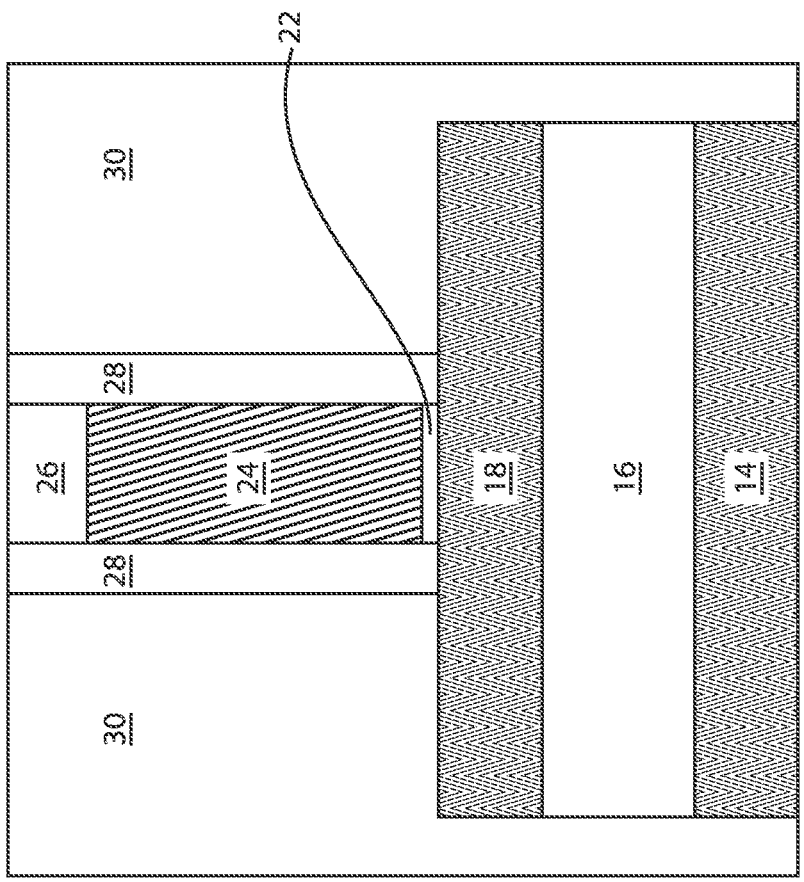
FIG. 7 is a cross-sectional view of FIG. 5 along a length of a fin where a dielectric layer is deposited over the sacrificial gate and spacers, in accordance with an embodiment of the present invention.

FIG. 7 is a cross-sectional view of FIG. 5 along a length of a fin where a dielectric layer is deposited over the sacrificial gate and spacers, in accordance with an embodiment of the present invention, whereas FIG. 8 is a cross-sectional view of FIG. 6 along a width of a fin where a dielectric layer is deposited over the sacrificial gate and spacers, in accordance with an embodiment of the present invention.

In various example embodiments, an interlevel dielectric (ILD) layer 30 is formed to laterally surround the sacrificial gate structure (22, 24, 26, 28). The ILD layer 30 can include a dielectric material such as undoped silicon oxide, doped silicon oxide, silicon nitride, porous or non-porous organosilicate glass, porous or non-porous nitrogen-doped organosilicate glass, or a combination thereof. The ILD layer 30 can be formed by CVD, PVD or spin coating. The thickness of the ILD layer 30 can be selected so that an entirety of the top surface of the ILD layer 30 is formed above the top surface of the sacrificial gate cap 26. The ILD layer 30 can be subsequently planarized, for example, by CMP and/or a recess etch using the sacrificial gate cap 26 as an etch stop. After the planarization, the ILD layer 30 has a topmost surface coplanar with the top surface of the sacrificial gate cap 26.

Figure 10:
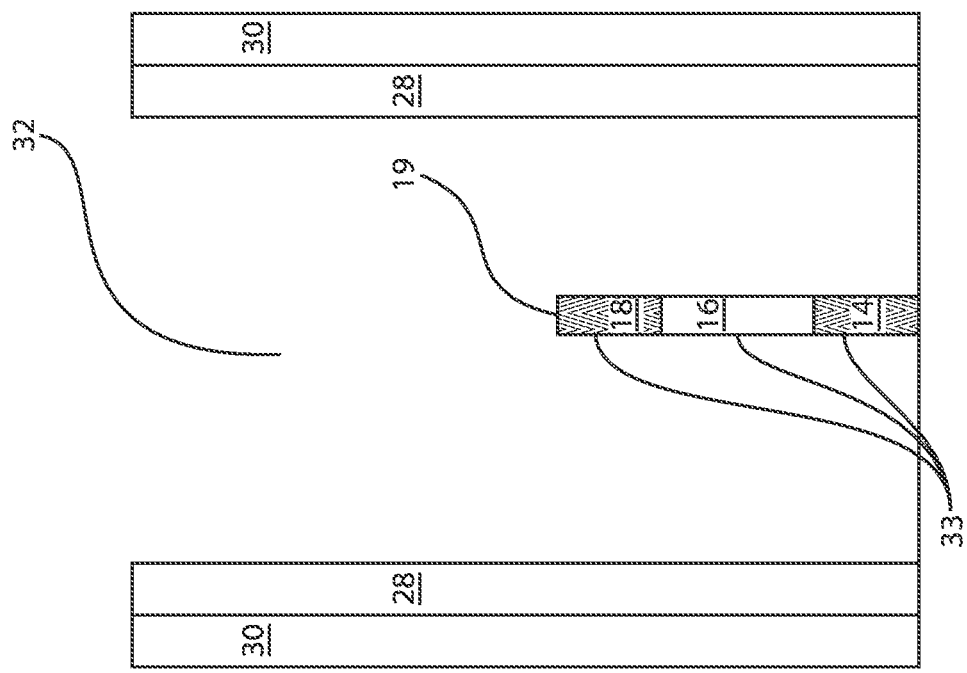
FIG. 10 is a cross-sectional view of FIG. 8 along a width of a fin where the sacrificial gate is removed to form a recess or gate opening, in accordance with an embodiment of the present invention.
Figure 9:
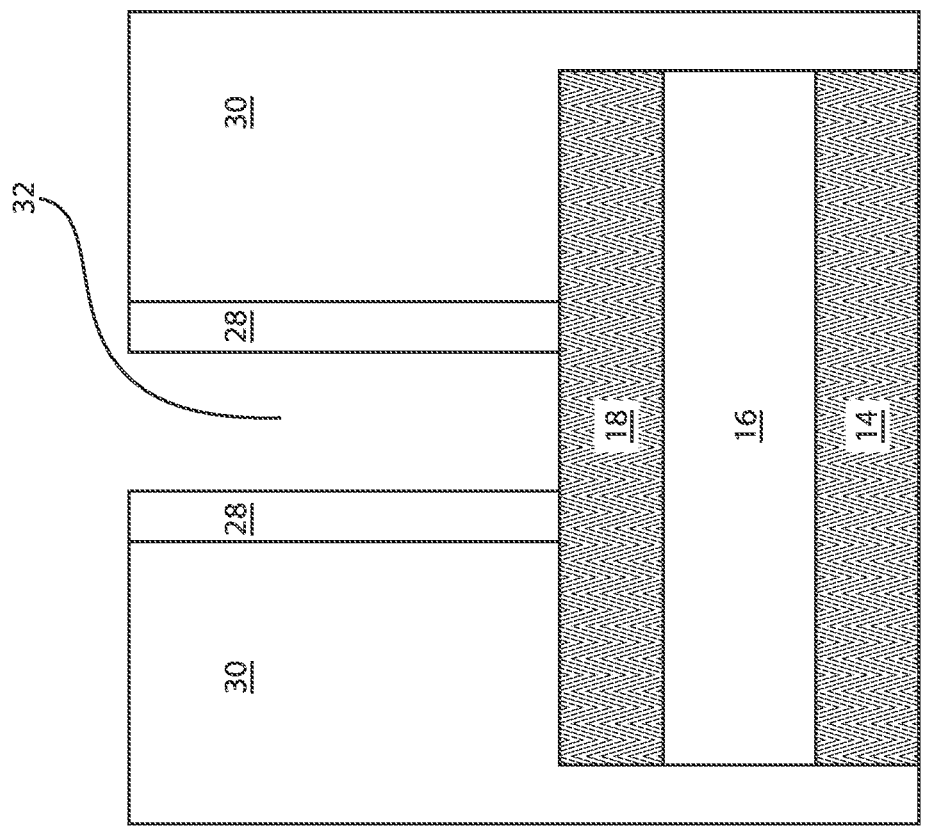
FIG. 9 is a cross-sectional view of FIG. 7 along a length of a fin where the sacrificial gate is removed, in accordance with an embodiment of the present invention.

FIG. 9 is a cross-sectional view of FIG. 7 along a length of a fin where the sacrificial gate is removed, in accordance with an embodiment of the present invention, whereas FIG. 10 is a cross-sectional view of FIG. 8 along a width of a fin where the sacrificial gate is removed to form a recess, in accordance with an embodiment of the present invention.

The sacrificial gate stack (22, 24, 26) in the sacrificial gate structure (22, 24, 26, 28) is removed to provide a gate cavity or gate opening 32. The sacrificial gate stack (22, 24, 26) can be removed selectively to the semiconductor materials of the first and the second semiconductor fins 14, 18 and the dielectric materials of the BOX layer 12, the dielectric fin 16, the gate spacers 28 and the ILD layer 30 by at least one etch. The at least one etch can be a dry etch and/or a wet chemical etch. The gate cavity 32 thus formed occupies a volume from which the sacrificial gate stack (22, 24, 26) is removed and is laterally confined by inner sidewalls of the gate spacers 28. The gate cavity 32 exposes the top surface 19 of the second semiconductor fin 18 and sidewalls 33 of the first semiconductor fin 14, the dielectric fin 16, and the second semiconductor fin 18.

Figure 12:
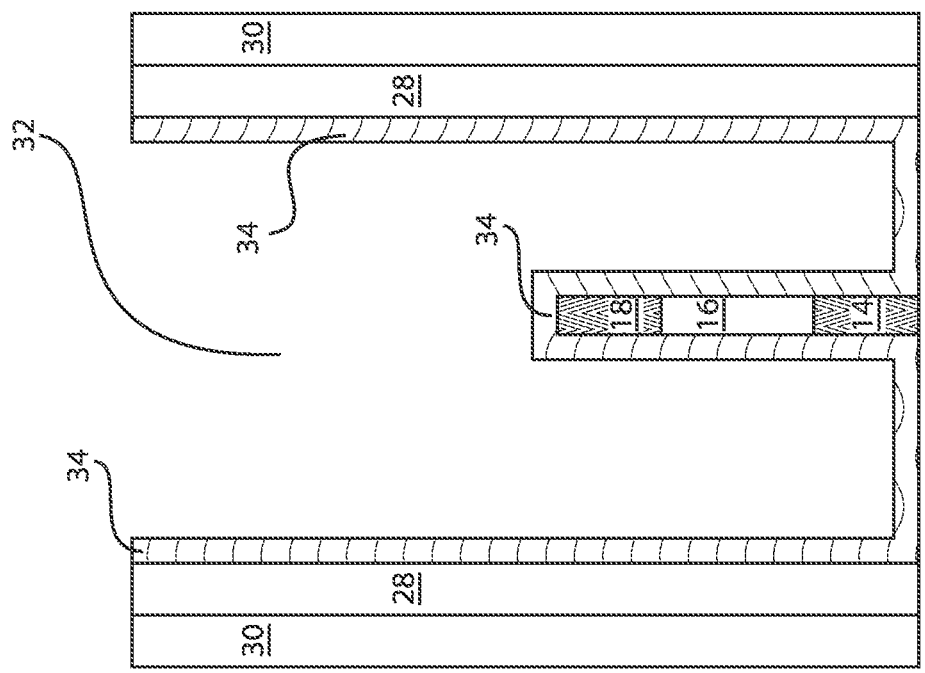
FIG. 12 is a cross-sectional view of FIG. 10 along a width of a fin where a high-k liner is deposited within the recess, in accordance with an embodiment of the present invention.
Figure 11:
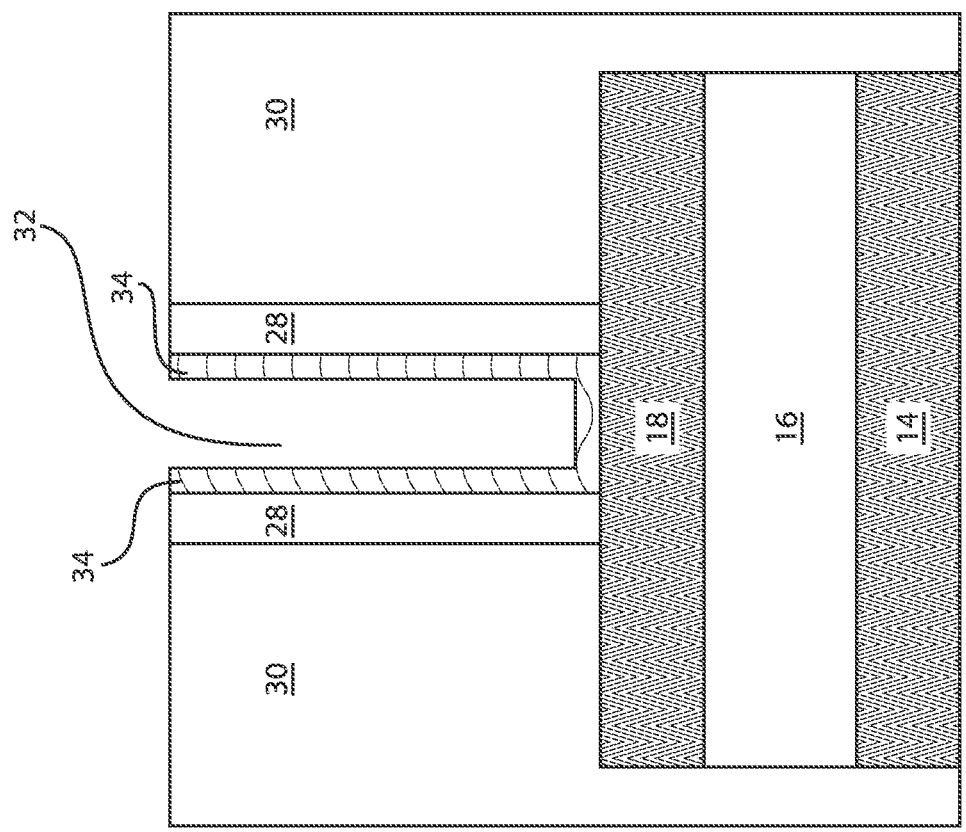
FIG. 11 is a cross-sectional view of FIG. 9 along a length of a fin where a high-k liner is deposited within the recess or gate opening, in accordance with an embodiment of the present invention.

FIG. 11 is a cross-sectional view of FIG. 9 along a length of a fin where a high-k liner is deposited within the recess, in accordance with an embodiment of the present invention, whereas FIG. 12 is a cross-sectional view of FIG. 10 along a width of a fin where a high-k liner is deposited within the recess, in accordance with an embodiment of the present invention.

A gate dielectric layer 34 is formed over sidewalls and a bottom surface of the gate cavity 32 and the topmost surface of the ILD layer 30. The gate dielectric layer 34 can be formed by conformally depositing a dielectric material by CVD or atomic layer deposition (ALD) over the sidewalls and the bottom surface of the gate cavity 32 and the topmost surface of the ILD layer 30. In one embodiment, the gate dielectric layer 34 includes a thick layer of a high-k material having a dielectric constant greater than silicon oxide. Exemplary high-k materials include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from about 0.5 to about 3 and each value of y is independently from 0 to about 2. In one example, the gate dielectric layer 34 can have a thickness from about 0.9 nm to about 10 nm. In another example, the gate dielectric layer 34 can have a thickness ranging from about 1.0 nm to about 3 nm.

Figure 14:
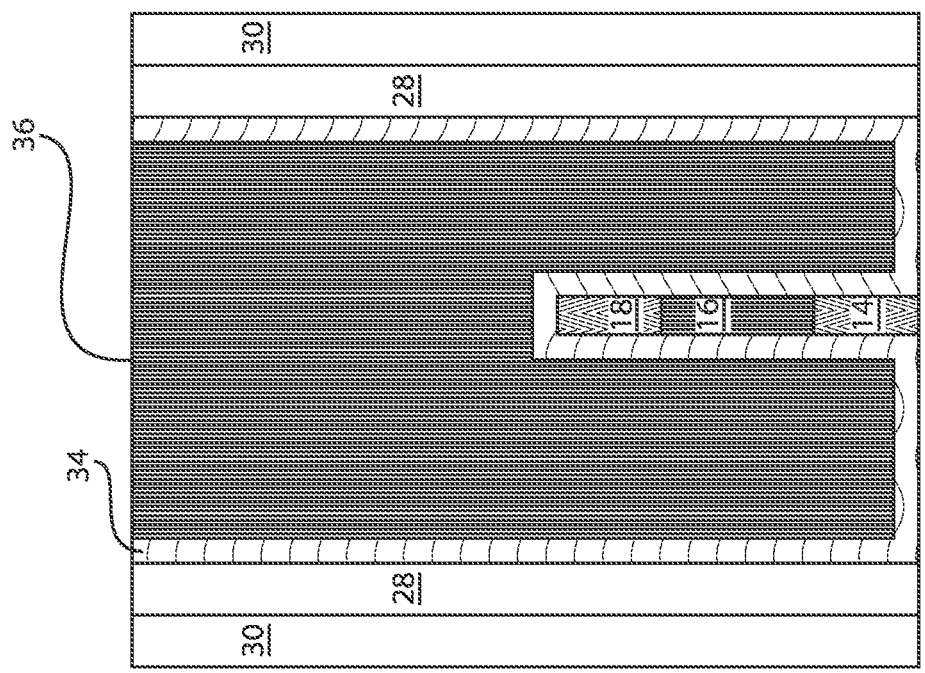
FIG. 14 is a cross-sectional view of FIG. 12 along a width of a fin where a metal gate is formed within the high-k liner, in accordance with an embodiment of the present invention.
Figure 13:
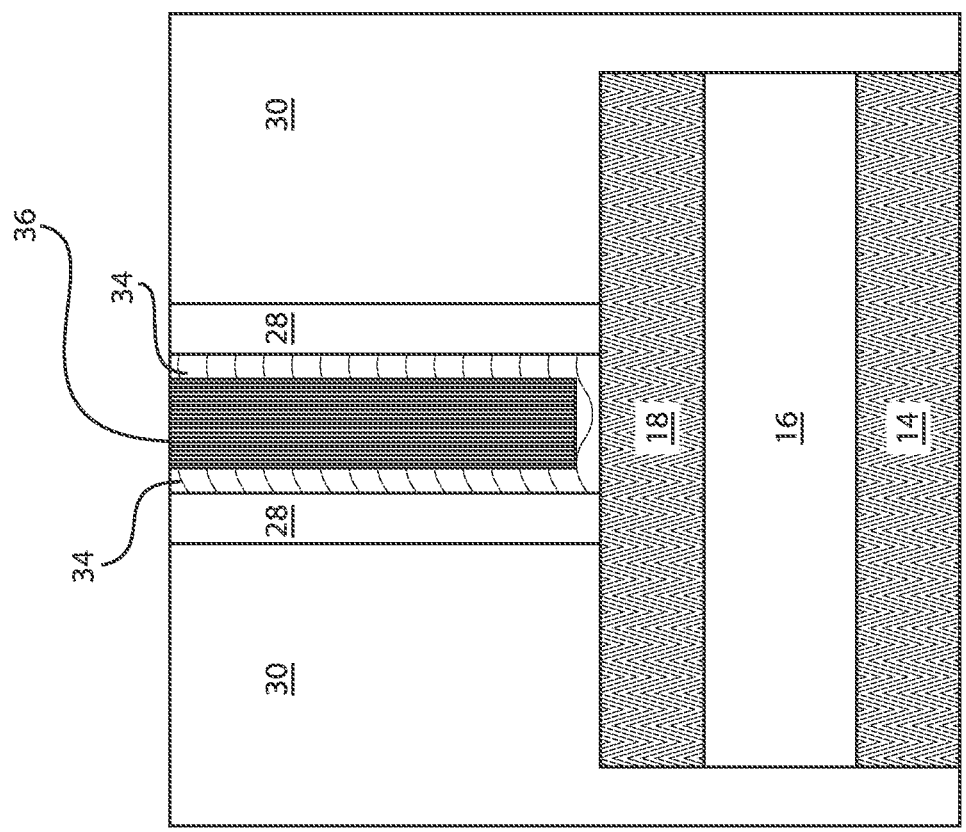
FIG. 13 is a cross-sectional view of FIG. 11 along a length of a fin where a metal gate is formed within the high-k liner, in accordance with an embodiment of the present invention.

FIG. 13 is a cross-sectional view of FIG. 11 along a length of a fin where a metal gate is formed within the high-k liner, in accordance with an embodiment of the present invention, whereas FIG. 14 is a cross-sectional view of FIG. 12 along a width of a fin where a metal gate is formed within the high-k liner, in accordance with an embodiment of the present invention.

In various example embodiments, a gate conductor layer 36 is formed over the thick high-k material 34. The gate conductor layer 36 can include any conductive material including, for example, doped polysilicon, Al, Au, Ag, Cu or W. The gate conductor layer 36 can be formed by a conventional deposition process such as, for example, CVD, PVD or ALD. Portions of the gate conductor layer 36 and the gate dielectric layer 34 that are located above the topmost surface of the ILD layer 30 are removed by employing a planarization process, such as, for example, CMP.

Figure 15:
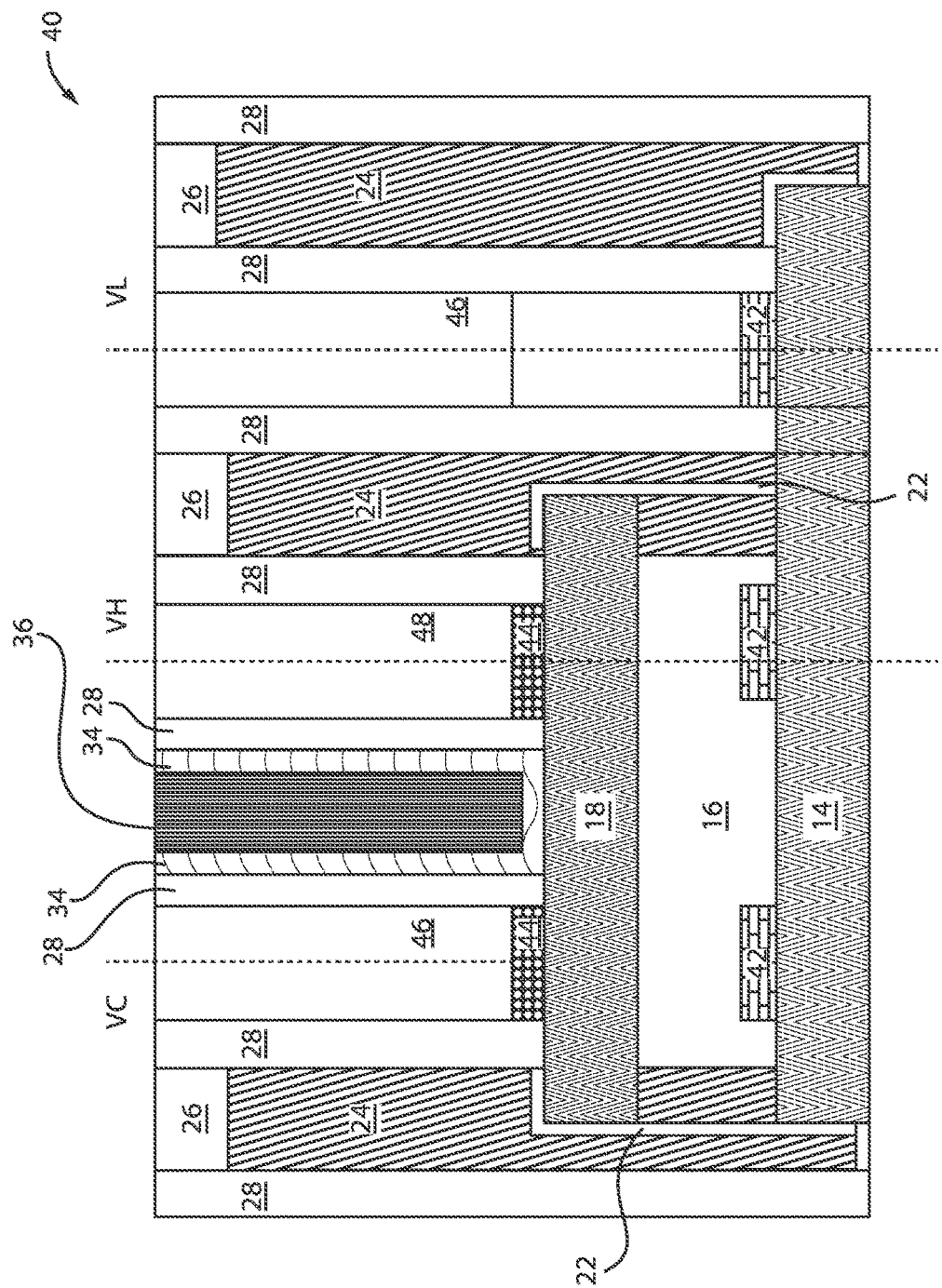
FIG. 15 is a cross-sectional view along a length of a fin where contacts are formed to complete the FinFET EEPROM structure, in accordance with an embodiment of the present invention.

FIG. 15 is a cross-sectional view along a length of a fin where contacts are formed to complete the FinFET EEPROM structure 40, in accordance with an embodiment of the present invention.

Because the source region and the drain region are both provided by doped regions on opposing sides of the channel of the device, and their function as a source region or a drain region is impacted by the bias applied to these regions in the final device structure, the term source/drain region is suitable for describing the doped regions in the absence of the bias that designates their type, i.e., function.

In various example embodiments, first source/drain regions 42 are formed to each of the first semiconductor fins 14, while second source/drain regions 44 are formed to each of the second semiconductor fins 18. The first source/drain regions 42 can be of a first conductivity type and the second source/drain regions 44 can be of a second conductivity type. The first conductivity type can be a p-type and the second conductivity type can be an n-type. The first conductivity type source/drain region 42 of the first fin can be electrically connected to the second conductivity type source/drain region 44 of the second fin. This results in the formation of a single floating gate in communication with a channel for each of the first and second fins, which is the common floating gate of the EEPROM device. Thus, the EEPROM device is formed by the electrical connection between the source/drain regions having different conductivity types through a common node (or common floating gate).

The first and the second source/drain regions 42, 44 can be formed utilizing ion implantation. In one embodiment where the first semiconductor fin 14 is for an n-type FinFET and the second semiconductor fin 18 is for a p-type FinFET, an n-type ion implantation is performed to dope an n-type dopant such as phosphorous into the first semiconductor fins 14 to provide the first source/drain regions 42, and a p-type ion implantation is performed to dope a p-type dopants such as boron into the second semiconductor fins 18 to provide the second source/drain regions 44. An activation anneal can be subsequently performed to activate the implanted dopants in the first and the second source/drain regions 42, 44. Moreover, various contact structures 46, 48 are formed. The contact structures include source/drain contact structures 46, 48 connecting the source/drain regions 42, 44. Contact openings (not shown) are formed by a combination of lithographic patterning and anisotropic etch. A contact material layer (not shown) is deposited in the contact openings to completely fill the contact openings. The contact material layer can include a metal such as, for example, W, Al, Cu or their alloys. The contact material layer can be formed by any suitable deposition method such as, for example, CVD, PVD or plating.

Stacked FinFET CMOS devices each having a second FinFET stacked on top of a first FinFET are thus formed. By electrically connecting the source/drain regions 42, 44 of the first and second conductivity types, a common floating gate is formed between the first and second FETs. In other words, stacked FinFET structures are integrated with EEPROM devices, where a common floating gate of the EEPROM device is formed between the first and second FETs. The two fin structures are connected through the common floating gate of the EEPROM device. The EEPROM device is fabricated during stacked FinFET CMOS fabrication to minimize process cost and improve system integration.

Figure 16:
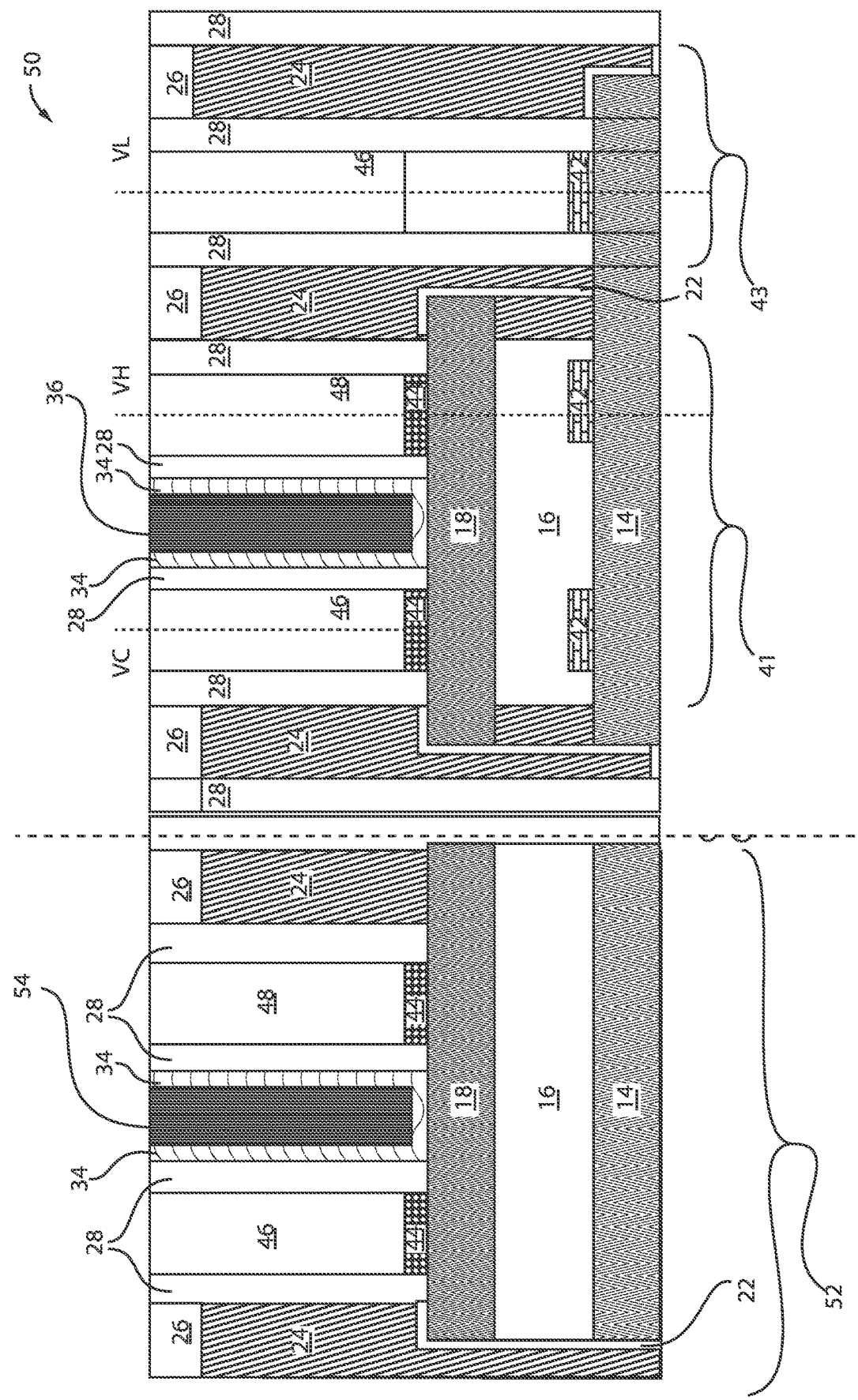
FIG. 16 is a cross-sectional view along a length of a fin where the FinFET EEPROM structure of FIG. 15 is integrated with a complementary metal oxide semiconductor (CMOS) structure, in accordance with an embodiment of the present invention.

FIG. 16 is a cross-sectional view along a length of a fin where the FinFET EEPROM structure of FIG. 15 is integrated with a complementary metal oxide semiconductor (CMOS) structure, in accordance with an embodiment of the present invention.

In various example embodiments, a CMOS structure 52 can be integrated with the FinFET EEPROM structure 50. The CMOS structure 52 includes a CMOS gate 54 instead of a floating gate. The CMOS structure 52 and the FinFET EEPROM structure 50 can work in cooperation with each other.

Figure 17:
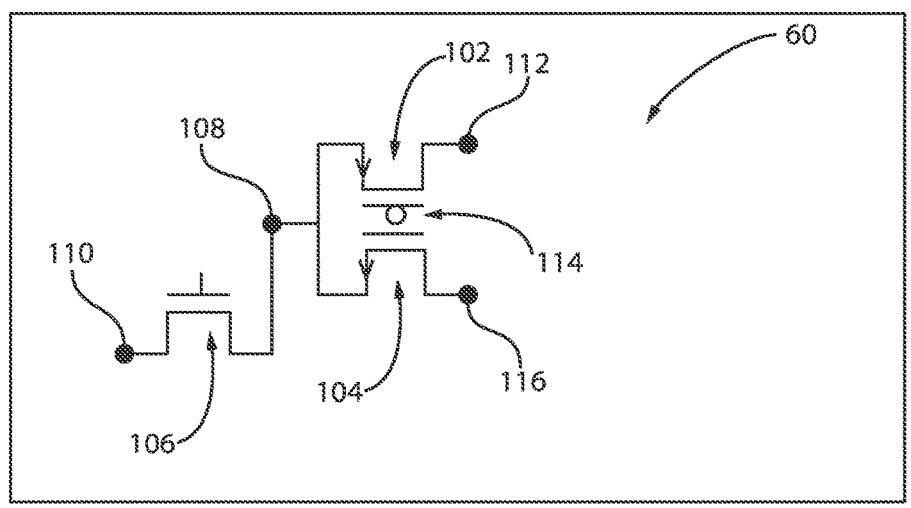
FIG. 17 is a circuit schematic of a memory cell, in accordance with the present invention.

Referring now to FIG. 17, a circuit schematic is shown for a single electrically erasable programmable read only memory (EEPROM) cell 60. The EEPROM device 60 is formed from a first transistor 102 and a second transistor 104 with a shared common floating gate or gate terminal 114. The transistors 102, 104 are arranged in parallel with a source/drain region of the first transistor 102 and a source/drain region of the second transistor 104 connected together at a common node 108. The parallel connection refers to current flow within the EEPROM cell 60. Current flows through transistor 102 to common node 108. Current also flows through transistor 104 to common node 108. The current then flows from common node 108 to low voltage terminal 110.

The other source/drain region of the first transistor 102 is connected to a voltage terminal 112, and the other source/drain region of the second transistor 104 is connected to a voltage terminal 116. An access transistor 106 is connected to a low voltage terminal 110 and the common node 108 in series. When the access transistor is turned on, the common node 108 is pulled down to approximately the same voltage as the low voltage terminal 110.

In one exemplary embodiment, the low voltage terminal 110 is at ground. It is specifically contemplated that the first transistor 102 is a pFET and that the second transistor 104 is an nFET. In one embodiment the access transistor 106 can be an nFET, though it should be understood that the particular configuration of the access transistor 106 can be adapted by those having ordinary skill in the art to the particular application. The first and second transistors 102 and 104 have a common terminal 108.

The access transistor 106 controls writing to and reading from the EEPROM memory cell 60. The state of the device is held by the state of the common floating gate 114. When the access transistor 106 is turned on, it pulls the common terminal 108 to approximately the same voltage as the low voltage terminal 110. When the common terminal 108 is pulled down to the same voltage as the low voltage terminal 110, hot carrier injection to the gate could occur in the first transistor 102 if a sufficiently high voltage is applied to terminal 112, and hot carrier injection to the gate could occur in the second transistor 104 if a sufficiently high voltage is applied to terminal 116. These charges due to hot carrier injection will remain on the floating gates until neutralized by charges of the opposite polarity (e.g., negatively charged electrons will remain until they meet a positively charged hole and holes will remain until they meet an electron).

In a CMOS device, electrons are free to move about in the semiconductor conduction band and holes are free to move about in the semiconductor valence band. The conduction band of the gate dielectric is at a higher electron energy level than the semiconductor conduction band. This energy difference represents a barrier energy for an electron getting from the semiconductor into the gate dielectric. For an electron to jump from the semiconductor into the gate dielectric, it has to acquire a kinetic energy comparable to or greater than this barrier energy.

An electron having a kinetic energy larger than its thermal energy, which is determined by the semiconductor temperature, is referred to as a "hot" electron. Similarly the valence band of the gate dielectric is at a higher hole energy level than the semiconductor valence band. This energy difference represents a barrier energy for a hole getting from the semiconductor into the gate dielectric. For a hole to jump from the semiconductor into the gate dielectric, it has to acquire a kinetic energy comparable to or greater than this hole barrier energy. A hole having a kinetic energy larger than its thermal energy is referred to as a "hot" hole.

For an FET that uses silicon dioxide for a gate dielectric layer, hot electrons generally need a kinetic energy of about 3.1 eV, which is barrier energy for electrons to be injected efficiently from the FET semiconductor into the FET gate dielectric. Hot electrons having smaller kinetic energy of, e.g., about 2.8 eV, can still be injected from the FET semiconductor into the FET gate dielectric by a tunneling process which is very inefficient. For a hot hole in such an FET, a higher kinetic energy of about 4.8 eV, which is the barrier energy for holes, is needed for it to be injected efficiently from the FET semiconductor into the FET gate dielectric. Hot holes having smaller kinetic energy of, e.g., about 3.1 eV, can only tunnel from the FET semiconductor into the FET gate dielectric, but at a negligibly slow rate.

The charge on the shared floating gate 114 determines which of the two transistors is active. The accumulated charges on the shared floating gate 114 will determine the voltage on the gate of the devices relative to their source terminals and will turn those devices off or on, such that appreciable current will flow between terminal 116 and the common terminal 108 or between terminal 112 and common terminal 108 when the access transistor 106 is activated.

Figure 18:
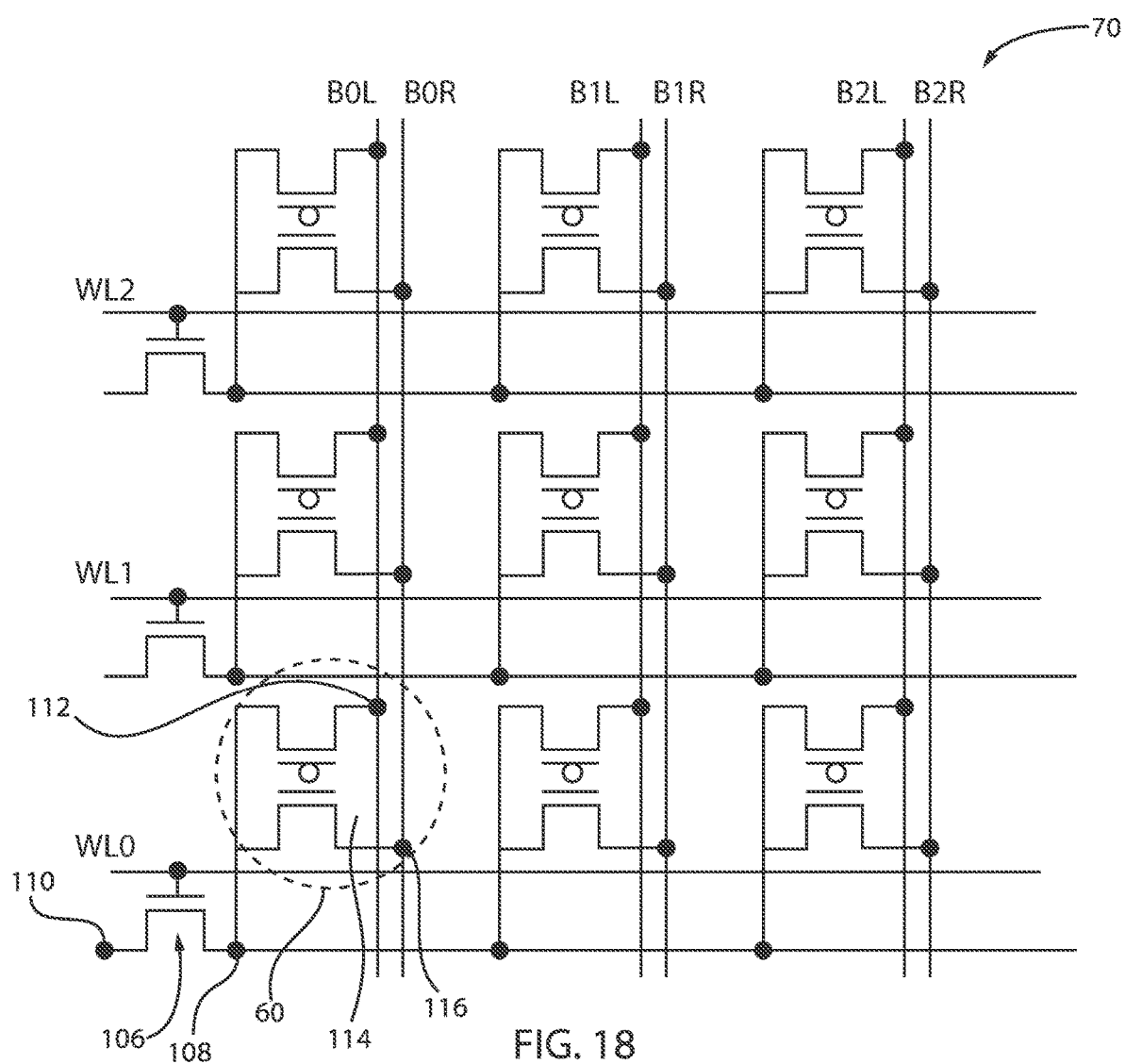
FIG. 18 is a circuit schematic of an array of memory cells, in accordance with the present invention.

Referring now to FIG. 18, an array 70 of EEPROM devices 60 is shown. This array 70 has a 3×3 grid of EEPROM devices 60, each with its access transistor connected to a low voltage at terminal 110 and to the common node 108 in series, the gate of the access transistor connected to wordline WL0, its terminal 112 of the parallel connected pFET 102 connected to a bitline B0L, and its terminal 116 of the parallel connected nFET 104 connected to a bitline B0R. It should be understood that an array of any size can be used instead. The array 70 can be built on, e.g., bulk semiconductor, semiconductor-on-insulator, or thin films of polycrystalline silicon on insulator.

The logic circuits that control the operation of a memory array can be fabricated on the same semiconductor substrate as the memory array to produce a memory chip, or they can be fabricated on a separate substrate and then packaged together with the memory array to form a memory package. These logic circuits are referred to herein as peripheral circuits. The peripheral circuits can be integrated with the memory array(s) on the same semiconductor substrate to improve speed and reliability. Alternatively, to reduce cost, which is important for large EEPROM systems, the peripheral circuits can be built on bulk semiconductor or semiconductor-on-insulator substrates independent of the array.

The common floating gate 114 of each EEPROM device 60 is programmed by avalanche hot-electron injection in the pFET 102 (writing a logical '1' to the device 60) and hot-hole injection in the nFET 104 (writing a logical '0'). Furthermore, the gate dielectric of the pFET 102 is chosen to enable fast injection of hot electrons at low voltage, and the gate dielectric of the nFET 104 is chosen to enable fast injection of hot holes at low voltage. As an example, for a pFET having HfO$_2$ as gate dielectric, hot-electron injection can be accomplished in less than 10 ns at a source-to-drain voltage of about 3V. For an EEPROM cell 60 operated with about 3V across its pFET 102 for avalanche hot-electron injection and about 3V across its nFET 104 for avalanche hot-hole injection, the applied voltages for array 70 during operation can be as follows.

When no action is being performed, during standby, the voltage on WL0=B0L=B0R=0V. The voltages for selecting a EEPROM device 60 for reading, writing a value '1' or writing a value '0' are as indicated in Table 1 below.

To write a value '1' to the EEPROM device 60, the wordline WL0 is raised to about 1.5V to turn on the access transistor 106, pulling the common node 108 to about 0V (the voltage of terminal 110), the bitline B0R is raised to about 3V so that there is little voltage across the pFET 102, and the bitline B0L is dropped to about 0V, resulting in a voltage of about 3V across the nFET 104, causing hot-hole injection in the nFET 104.

To write a value '0' to the EEPROM device 60, the wordline WL0 raised to about 1.5V to turn on the access transistor 106, pulling the common node 108 to about 0V (the voltage of terminal 110), the bitline B0L is raised to about 3V so that there is little voltage across the nFET 104, and the bitline B0R is dropped to about 0V to create a voltage of about 3V across the pFET 102, causing hot-electron injection in the pFET 102.

To read the value of the device, the wordline WL0 is raised to about 1.5V to turn on the access transistor 106, pulling the common node 108 to about 0V (the voltage of terminal 110), the voltage of B0L and B0R drops to about 1V, creating a voltage of about 1V across the pFET 102 and a voltage of about 1V across the nFET 104.

Table 1 shows the different values for WL0, B0L, and B0R for a cell (0,0) in the array. The voltage could vary by about 10% in this specific embodiment without affecting proper operation of the array.

In general, the time needed for hot-carrier injection in pFET 102 and nFET 104 is a strong function of the voltage across the devices during injection. For example, for a pFET having silicon dioxide (SiO$_2$) as gate dielectric, the rate of hot electron injection can increase by about 10× when the device voltage is changed from about 3V to about 3.5V. A 10% voltage variation is well within the design of conventional integrated circuit chips.

TABLE 1

|  | WL0 | B0L | B0R |
| --- | --- | --- | --- |
| Write '1' | 1.5 V | 0 V | 3.0 V |
| Write '0' | 1.5 V | 3.0 V | 0 V |
| Read | 1.5 V | 1.0 V | 1.0 V |

For non-selected cells on the same wordline, for example when writing a '1' to another cell, the voltage across the pFET 102 will be about 0V and there will be negligible hot-electron injection in the pFET 102. Similarly, when writing a '0' in another cell, the voltage across the non-selected nFETs 104 will be about 0V, resulting in negligible hot-hole injection in the nFETs 104. For non-selected cells on the same output bitline the common node 108 is "floating," being isolated from terminal 110 because the access transistor is not turned on. This causes the voltage between bitline B0L and bitline B0R to be divided between the nFET and the pFET. The net result is that the voltage across either the nFET or the pFET is not large enough to cause hot carrier injection in either the nFET or the pFET.

The use of low injection-barrier materials in the EEPROM devices 60 provide superior efficiency, as significantly lower voltages can be used as compared to when conventional materials are used. For example, with a silicon dioxide gate dielectric layer, there is negligible hot-electron injection at voltages less than about 2.5V whereas, with a low injection-barrier material such as HfO$_2$, appreciable hot-electron injection can be achieved at voltages starting at about 1.5V. For programming with electron injection densities of about $1 \cdot 10^{12}$/cm, a semiconductor-on-insulator pFET with an HfO$_2$ gate dielectric can be programmed in less than 10 ns at a voltage of 2.5V.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for integrating a stack of fin field effect transistors (FinFETs) to form an electrically erasable programmable read-only memory (EEPROM) device (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
a first FET including a first channel region present in a first fin structure, the first FET connected to a first terminal and a common node;
a second FET including a second channel region present in a second fin structure connected to a second terminal and the common node, wherein the first fin structure and second fin structure are stacked to provide that first sidewalls of the first fin structure are aligned with second sidewalls of the second fin structure;
first source/drain regions directly contacting the first fin structure;
second source/drain regions directly contacting the second fin structure;
an access transistor connected in series to the common node and a low voltage terminal; and
a common floating gate of an electrically erasable programmable read-only memory (EEPROM) memory device, the EEPROM memory device constructed during the stacking of the first and second FETs,
wherein a centerpoint of one of the first source/drain regions is vertically offset from a centerpoint of a corresponding one of the second source/drain regions.

2. The semiconductor device of claim 1, wherein the source/drain region of the first FET is electrically connected to the source/drain region of the second FET.

3. The semiconductor device of claim 1, wherein the first FET is a p-type FinFET transistor and the second FET is an n-type FinFET transistor.

4. The semiconductor device of claim 1, wherein the first FET includes a low injection-barrier material gate dielectric and the second FET includes a low injection-barrier material gate dielectric.

5. The semiconductor device of claim 1, wherein the voltage of the common floating gate determines a logical state of the semiconductor device.

6. A semiconductor structure, comprising:
a stack of at least a first fin structure and a second fin structure;
first conductivity type source/drain regions present on opposing ends of a first channel region of the first fin structure;
second conductivity type source/drain regions present on opposing ends of a second channel region of the second fin structure; and
a single floating gate present on both of the first and second channel regions of the first and second fin structures, wherein the single floating gate provides electrical communication between a first field effect transistor including the first fin structure and a second field effect transistor including the second fin structure in an electrically erasable programmable read-only memory (EEPROM) memory device, the EEPROM memory device constructed during the stacking of the first and second fin structures,
wherein a centerpoint of one of the first conductivity type source/drain regions is vertically offset from a centerpoint of a corresponding one of the second conductivity type source/drain regions.

7. The semiconductor structure of claim 6, wherein the stack of the first and second fin structures comprises the second fin structure overlying the first fin structure so that first sidewalls of the first fin structure are aligned with second sidewalls of the second fin structure.

8. The semiconductor structure of claim 7, wherein a dielectric layer separates the first fin structure from the second fin structure, wherein dielectric sidewalls are aligned with the first and second sidewalls of the first and second fin structures, respectively.

9. The semiconductor structure of claim 8, wherein said single floating gate comprises:
a continuous gate dielectric in contact with said first sidewalls in said first channel region of said first fin structure, the sidewalls of the dielectric layer, and said second sidewalls in said second channel region of said second fin structure; and
a gate conductor present on the gate dielectric.

10. The semiconductor structure of claim 6, wherein one of the first conductivity type source/drain regions to the first fin structure is electrically connected to one of the second conductivity type source/drain regions to the second fin structure.

11. The semiconductor structure of claim 10, wherein the electrically connected first conductivity type source/drain region and second conductivity type source/drain region is a common node having connection to an access transistor to the EEPROM device.

12. The semiconductor structure of claim 10, wherein the first FET and the second FET are formed within an EEPROM cell of an array of EEPROM cells.

13. A semiconductor structure, comprising:
a stack of at least a first fin structure and a second fin structure;
first conductivity type source/drain regions present on opposing ends of a first channel region of the first fin structure;
second conductivity type source/drain regions present on opposing ends of a second channel region of the second fin structure; and
a single floating gate of an electrically erasable programmable read-only memory (EEPROM) memory device present on both of the first and second channel regions of the first and second fin structures, the EEPROM memory device constructed during the stacking of the first and second FETs,
wherein a centerpoint of one of the first conductivity type source/drain regions is vertically offset from a centerpoint of a corresponding one of the second conductivity type source/drain regions.

14. The semiconductor structure of claim 13, wherein the single floating gate provides electrical communication between a first field effect transistor including the first fin structure and a second field effect transistor including the second fin structure in an electrically erasable programmable read-only memory (EEPROM) memory device.

15. The semiconductor structure of claim 14, wherein the stack of the first and second fin structures comprises the second fin structure overlying the first fin structure so that first sidewalls of the first fin structure are aligned with second sidewalls of the second fin structure.

16. The semiconductor structure of claim 15, wherein a dielectric layer separates the first fin structure from the second fin structure.

17. The semiconductor structure of claim 16, wherein dielectric sidewalls are aligned with the first and second sidewalls of the first and second fin structures, respectively.

18. The semiconductor structure of claim 17, wherein the single floating gate includes a continuous gate dielectric in contact with said first sidewalls in said first channel region of said first fin structure, the sidewalls of the dielectric layer, and said second sidewalls in said second channel region of said second fin structure.

19. The semiconductor structure of claim 18, wherein the single floating gate further includes a gate conductor present on the gate dielectric.

* * * * *